United States Patent [19]

Strahl et al.

[11] Patent Number: 4,717,461
[45] Date of Patent: Jan. 5, 1988

[54] SYSTEM AND METHOD FOR PROCESSING WORKPIECES

[75] Inventors: Thomas L. Strahl, Fremont; Lawrence T. Lamont, Jr., San Jose; Carl T. Peterson, Fremont; Hobart A. Brown, Santa Cruz; Lonnie W. McCormick, Cupertino; Roderick C. Mosely, Mountain View, all of Calif.

[73] Assignee: Machine Technology, Inc., Parsippany, N.J.

[21] Appl. No.: 907,578

[22] Filed: Sep. 15, 1986

[51] Int. Cl.⁴ .............................................. C23C 14/00
[52] U.S. Cl. .................................. 204/192.1; 118/720; 156/643; 204/192.11; 204/192.12; 204/192.25; 204/298; 427/34; 427/39; 437/225
[58] Field of Search ........... 204/192.1, 192.11, 192.12, 204/192.25, 298; 427/34, 39, 88, 90, 91; 156/643; 118/720

[56] References Cited

U.S. PATENT DOCUMENTS

| 4,405,435 | 9/1983 | Tateishi et al. | 204/298 |
| 4,477,311 | 10/1984 | Mimura et al. | 204/192.25 |
| 4,534,314 | 8/1985 | Ackley | 204/298 |
| 4,560,462 | 12/1985 | Radford | 204/298 |
| 4,587,002 | 5/1986 | Bok | 118/720 |
| 4,622,918 | 11/1986 | Bok | 118/720 |
| 4,650,064 | 3/1987 | Slabaugh | 204/298 |
| 4,661,228 | 4/1987 | Mintz | 204/298 |

Primary Examiner—Arthur P. Demers
Attorney, Agent, or Firm—Lerner, David, Littenberg, Krumholz & Mentlik

[57] ABSTRACT

A method of processing a plurality of semiconductor wafers from a wafer cassette including a wafer transfer housing and one or more processing chambers. A wafer is removed from its cassette and transported through the transfer housing into one or more processing chambers for etching, deposition or other such operations. The processed wafer is replaced into its cassette after being transported back through the wafer transfer housing.

14 Claims, 21 Drawing Figures

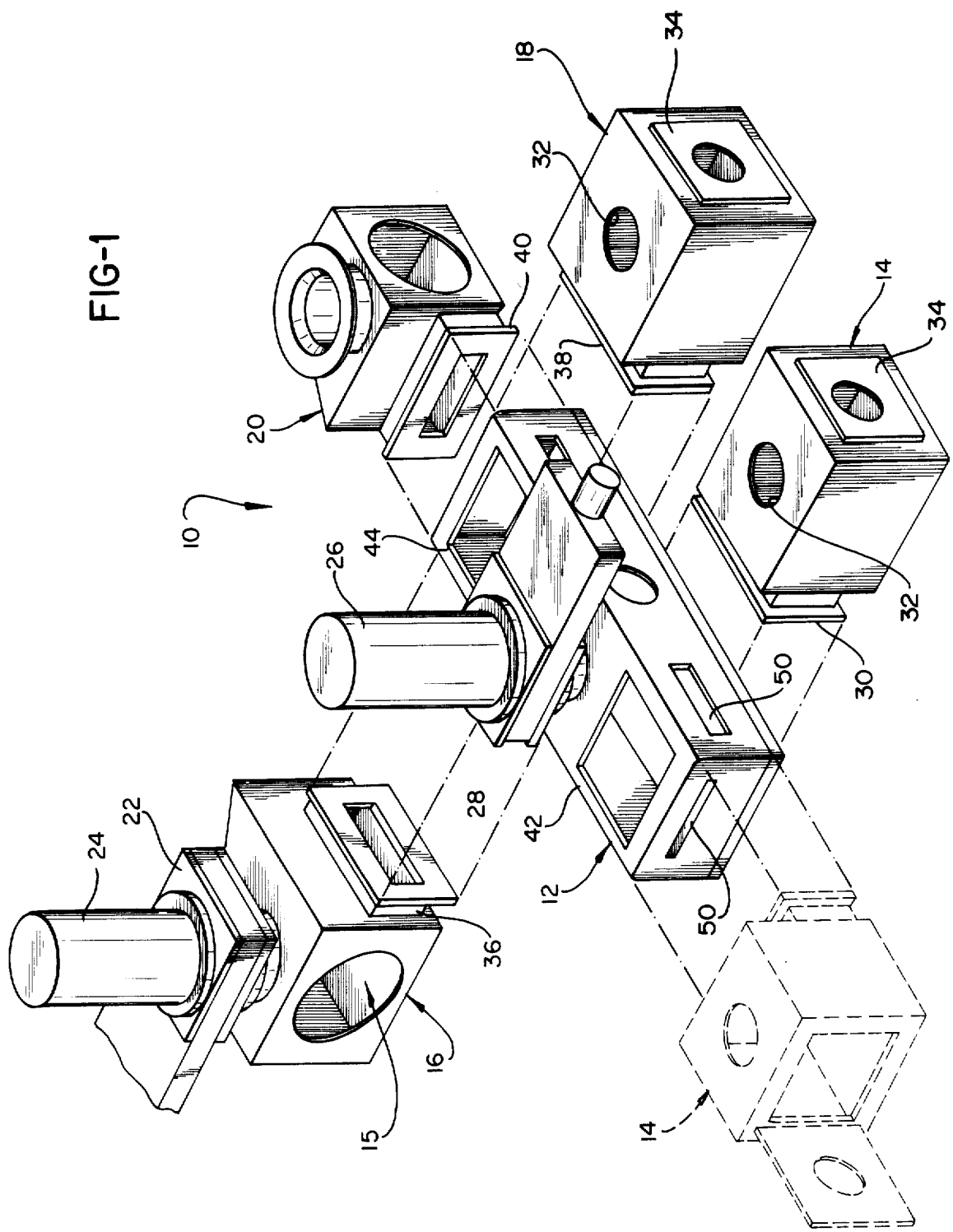

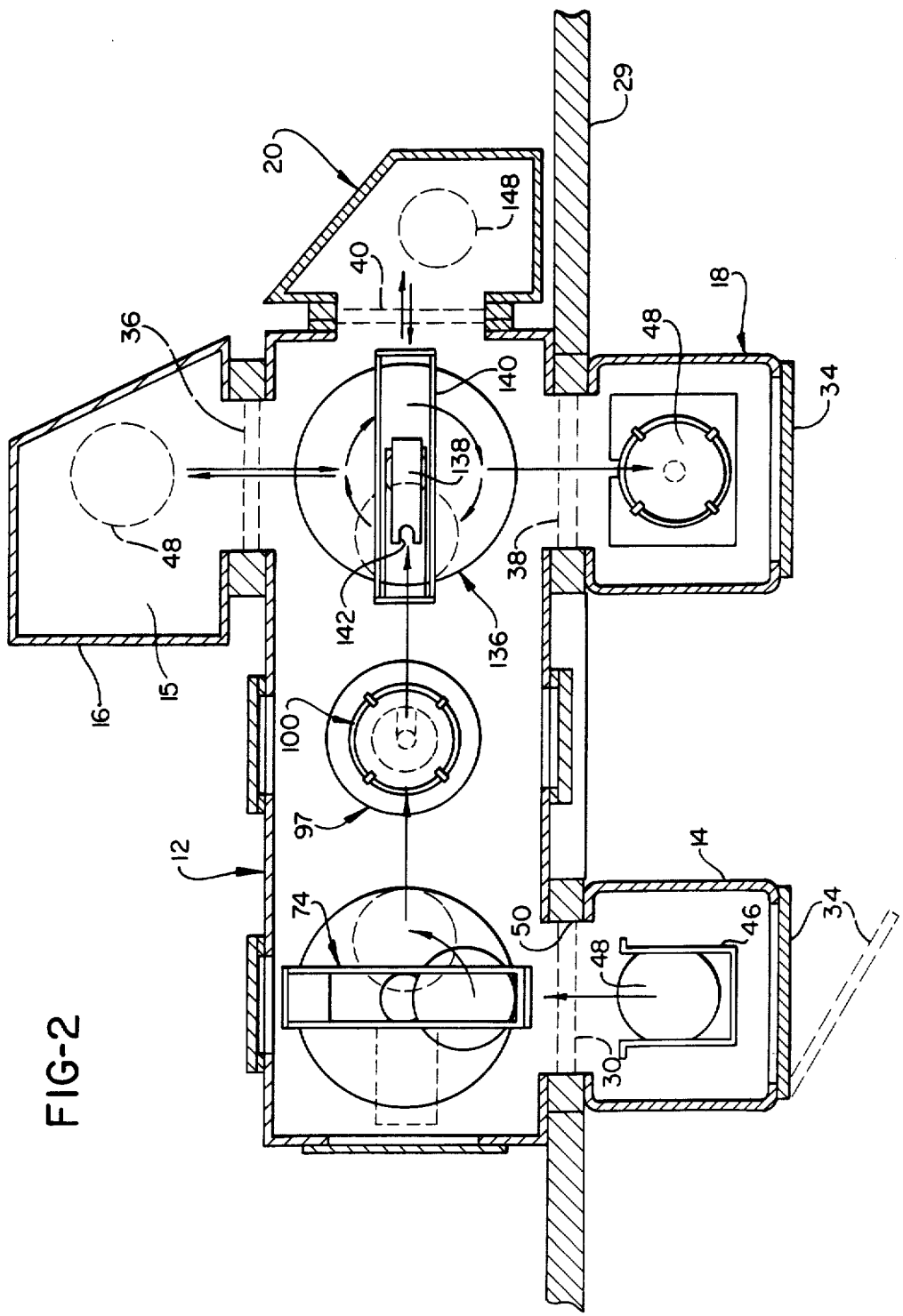

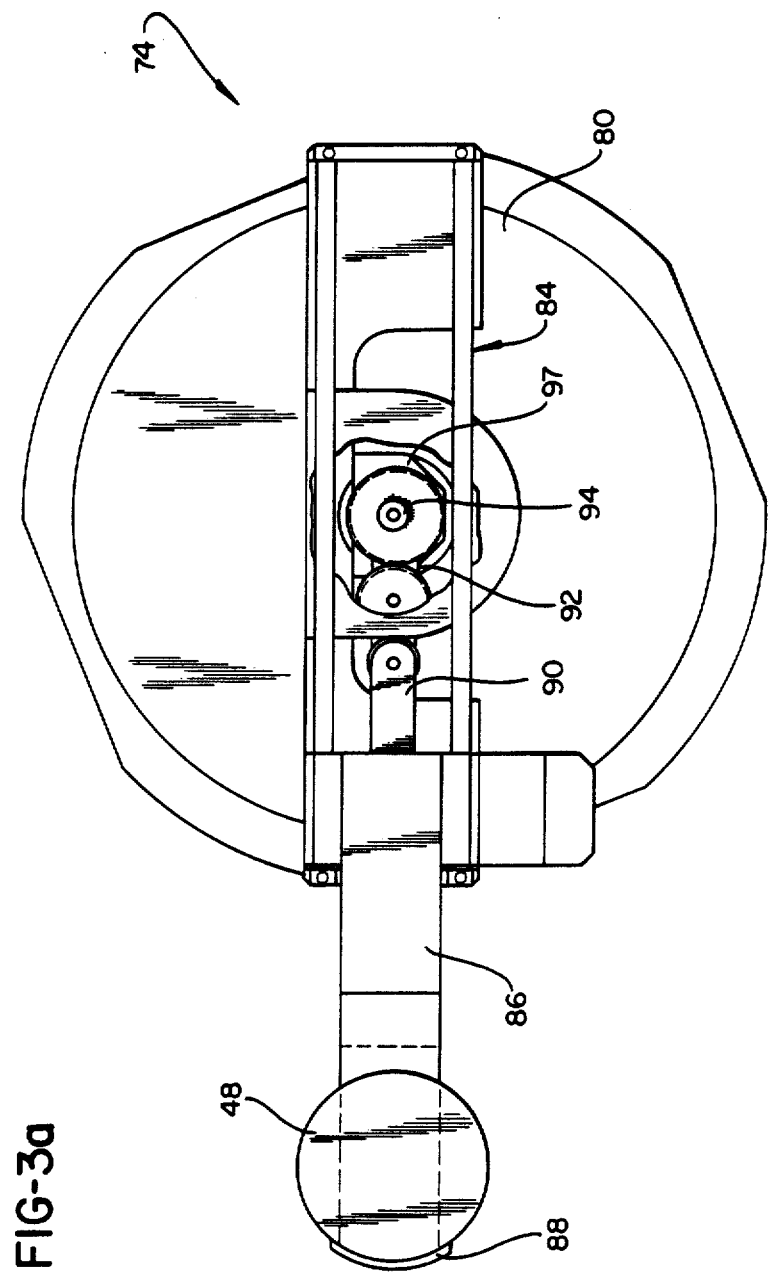

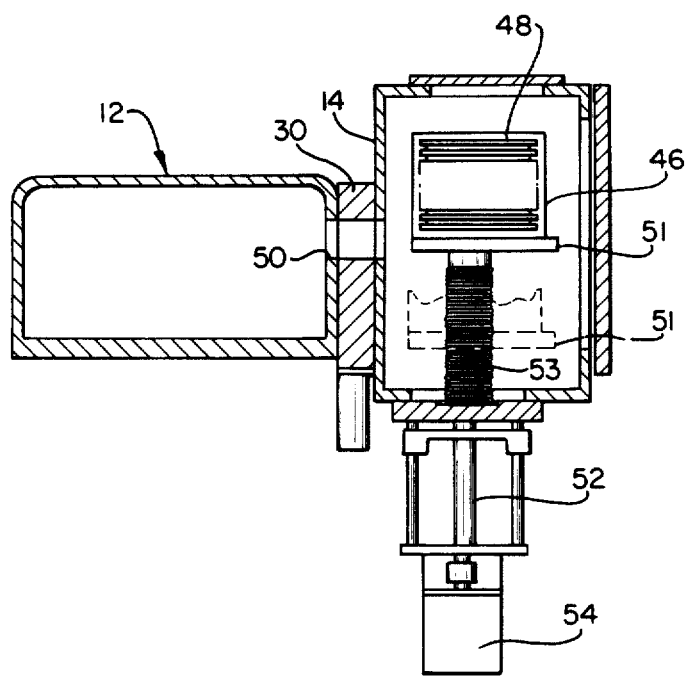

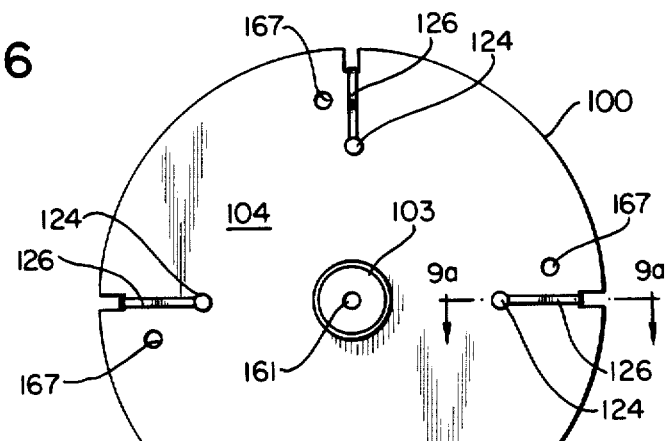
FIG-6
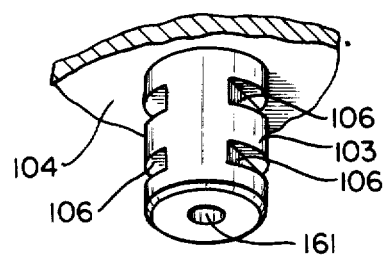
FIG-7
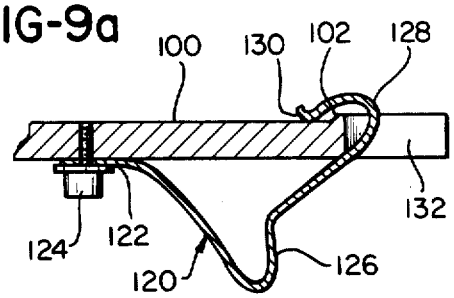
FIG-9a
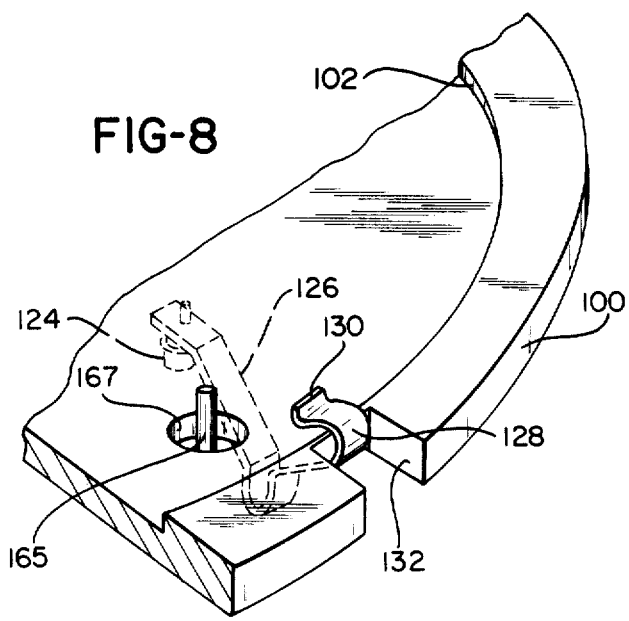
FIG-8
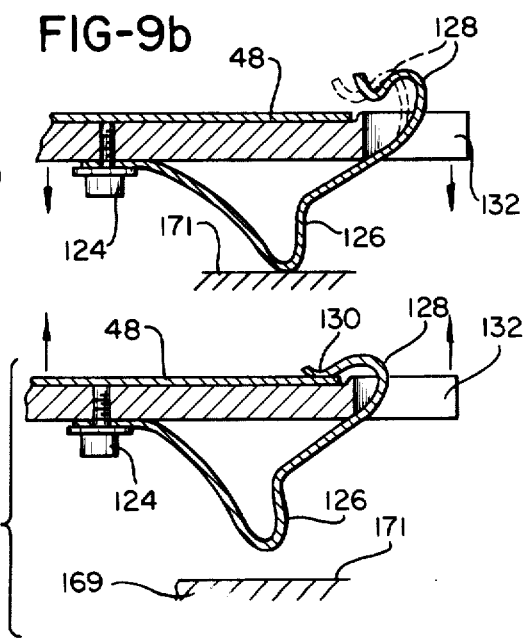
FIG-9b
FIG-9c

SYSTEM AND METHOD FOR PROCESSING WORKPIECES

BACKGROUND OF THE INVENTION

The present invention relates in general to improvements in the handling of workpieces of different types and, more particularly, to a system and method for processing and handling workpieces, such as semiconductor wafers, during production thereof.

In an effort to increase the production yield and to minimize production costs of semiconductor wafers, attempts have been made in the past to automate the deposition of thin films on the surfaces of semiconductor wafers. Such attempts generally have not been satisfactory for one or more reasons, primarily due to the fact that conventional systems for automating such production have been complex in construction and expensive to produce and maintain. Because of these limitations, a need exists for improvements in a system and method for automating the processing of workpieces, particularly semiconductor wafers, which must be handled quickly and efficiently and without damage to the wafers when they are transferred between stations of the system. The present invention satisfies this need.

SUMMARY OF THE INVENTION

The present invention is directed to an improved system and method for processing and handling of workpieces, especially semiconductor wafers which are to be provided with a thin film on the working faces thereof by a deposition surface, such as a sputter source. Specifically, the system of the present invention is designed to be a system for the metallization of wafers one by one, whereby the wafers can be coated with aluminum or aluminum alloys by high rate planar magnetron sputtering.

To achieve these aims, the system of the present invention comprises a series of modular components including a first central housing coupled at an inlet end thereof to a second inlet housing adapted to contain in a holder a plurality of workpieces to be processed one by one by the system. The first housing is also provided with an outlet end coupled to a third housing defining a process chamber, whereby a workpiece from the second housing can be drawn into the first housing and advanced to the outlet end and into the third housing for processing in the process chamber. A typical processing step is the deposition of a thin film on one face of the workpiece.

A fourth housing can be coupled to the first housing to provide an additional process chamber, such as an etch chamber for wafers after they have been processed in the third chamber. The wafers are returned, after being processed, to the second housing where they are loaded in the holder from whence they were removed for processing in the process chamber or chambers.

The modular components of the system permit the workpieces to be placed in the second inlet housing when the second housing is on one side of a wall in a first room, while the other housings of the system are in a second room on the opposite side of the wall. In this way, cross-contamination between the rooms can be avoided by the use of an isolation valve coupling first and second housings together.

The processing of workpieces with the system of the present invention permits continuous, crack-free step coverage by thin film deposition over an 80° to 90° wall step of 50% or better without heat. The system also provides for high uniformity coating across 100 millimeter, 125 millimeter, 150 millimeter or 200 millimeter semiconductor wafers. The system provides for fully automatic operation for simplified operation and production. The throughput can be as high as 40 to 45 wafers per hour with a 10 kilowatt power supply for the deposition source and 50 wafers or better per hour with a 20 kilowatt power source. The system can be provided with a remote CRT unit to provide for a control and override of the system when desired or deemed necessary. The system of the present invention is suitable for use with a through-the-wall type mount between a class 100 clean room and a class 10,000 service bay.

In the practice of the method of the present invention, a single standard cassette loaded with semiconductor wafers or other workpieces is placed in the second housing and the system is operated. The second housing is evacuated to a predetermined negative pressure, and the isolation valve between the first and second housings is opened, allowing a wafer transfer bar to remove a single wafer from the cassette and place it at a central zone in the first housing on a wafer carrier where it is releasably secured by hold down means, such as resilient spring clips.

A second transfer bar becomes coupled to the carrier and moves the carrier into the third housing or process chamber. After an isolation valve of the process chamber is opened, the second transfer bar places the carrier and wafer thereon on a fixture and then retracts into the first housing.

With the process chamber isolation valve closed, the carrier and wafer are placed in a vertical plane in confronting relationship to a deposition source. During a deposition cycle, a second wafer can be loaded onto a separate carrier, and the second carrier can be placed in a dwell chamber in a fourth housing offset from the process chamber and coupled to the first housing. At the completion of the deposition cycle, the first carrier transport sequence is reversed, placing the coated wafer on the carrier and transferring the wafer to the second housing. The second transfer arm returns to the dwell chamber for the next loaded wafer carrier, transferring it to the process chamber for the deposition step. The dwell chamber provides access for replacing wafer carriers in a small volume lock without venting the first housing to ambient atmosphere. The carrier exchange can be accomplished in less than 30 minutes for the two carriers. Return of the wafers to the cassette completes the system operation and the process can be repeated for the next set of wafers placed in another cassette and deposited in the second inlet housing.

The primary object of the present invention is to provide a system and method for processing and handling of workpieces wherein a plurality of workpieces in a holder can be placed in the inlet chamber adjacent to the inlet end of a transfer chamber having transfer mechanisms therein and directed one by one to a process chamber at the outlet end thereof and wherein workpieces can be taken one by one from the inlet chamber and fed into the process chamber for processing, such as the deposition of a thin film on a face of each wafer, all of which can be done in an automated fashion at a relatively high rate and without operator attention, except for the placement of the workpiece holder in the inlet chamber and the removal of the holder from the inlet chamber.

Another object of the present invention is to provide a system and method of the type described, wherein the system is simple and rugged in construction, can be automatically operated and can provide a high throughput without operator attention, and without requiring a large amount of space, yet the method can be suitable for practice in a clean room, while loading capability for the workpieces is in a separate room to thereby avoid cross-contamination between the loading, processing and unloading of workpieces.

In accordance with one embodiment of the present invention, there is disclosed a system for processing a plurality of workpieces comprising a first housing having an inlet end and an outlet end defining a transfer region for transferring workpieces between the inlet and outlet ends, a second housing coupled to the first housing near the inlet end thereof, the first housing adapted to contain a plurality of workpieces to be processed, a third housing coupled to the first housing at the outlet end thereof, the third housing defining a process chamber, first means in the first housing for transferring a workpiece from the second housing into the first housing through the inlet end of the first housing and to a first zone therein, a workpiece carrier at the first zone for supporting a workpiece after the workpiece has been transferred to the first zone by the first means, and second means in the first housing for transferring the carrier from the first zone toward and into the third housing for processing the workpieces thereon.

In accordance with another embodiment of the present invention, there is disclosed a method of processing a plurality of workpieces comprising placing a plurality of workpieces in a first chamber adjacent to a transfer region, moving a workpiece out of the first chamber into the transfer region when the first chamber is closed to the ambient atmosphere, advancing the workpiece through the transfer region and into a second chamber, processing the workpiece in the second chamber, returning the workpiece through the transfer region to the first chamber, and repeating the moving, advancing, processing and returning steps for each workpiece of the plurality until all of the workpieces have been processed in the second chamber.

In accordance with another embodiment of the present invention, there is disclosed a carrier for releasably securing a workpiece, the carrier comprising a body having a surface for supporting a workpiece thereon, and securing means coupled to the body for releasably securing a workpiece, the securing means comprising an arcuate element having an end for engaging the workpiece and actuating means for displacing the end into and out of engagement with said workpiece, the end being initially displaced substantially normal to the surface of the workpiece and then substantially radially outward upon actuation of the actuating means, whereby the workpiece is movable relative to the body.

BRIEF DESCRIPTION OF THE DRAWINGS

The above description, as well as further objects, features and advantages of the present invention will be more fully understood by reference to the following detailed description of a presently preferred, but nonetheless illustrative, system and method for processing workpieces in accordance with the present invention, when taken in conjunction with the accompanying drawings, wherein:

FIG. 1 is a perspective exploded view of the apparatus of the present invention for coating a plurality of workpieces, such as semiconductor wafers;

FIG. 2 is a top plan view of the apparatus of FIG. 1, showing the apparatus with its various components coupled together in accordance with one embodiment of the present invention shown in FIG. 1;

FIGS. 3a and 3b are a top plan view and a vertical section, respectively, of the workpiece transfer mechanism of the apparatus of FIGS. 1 and 2;

FIG. 4 is a vertical section through a portion of the apparatus, showing the way in which a plurality of workpieces in the form of semiconductor wafers are mounted by a cassette in an inlet housing;

FIG. 6 is a bottom plan view of a wafer carrier of the present invention showing the bottom portions of the clips for releasably holding a wafer on the upper surface of the carrier;

FIG. 7 is a fragmentary perspective view of the shaft at the base of the wafer carrier of FIG. 6 for releasably mounting the carrier on a pedestal;

FIG. 8 is a fragmentary perspective view of the wafer carrier showing a clip in an operating position for holding a wafer on the upper surface of the carrier;

FIGS. 9a, 9b and 9c are vertical sections through the wafer carrier of FIG. 6, showing a spring clip, in a first wafer holding position, a second wafer releasing position, and the first wafer holding position, respectively;

DETAILED DESCRIPTION

Figure 3B:
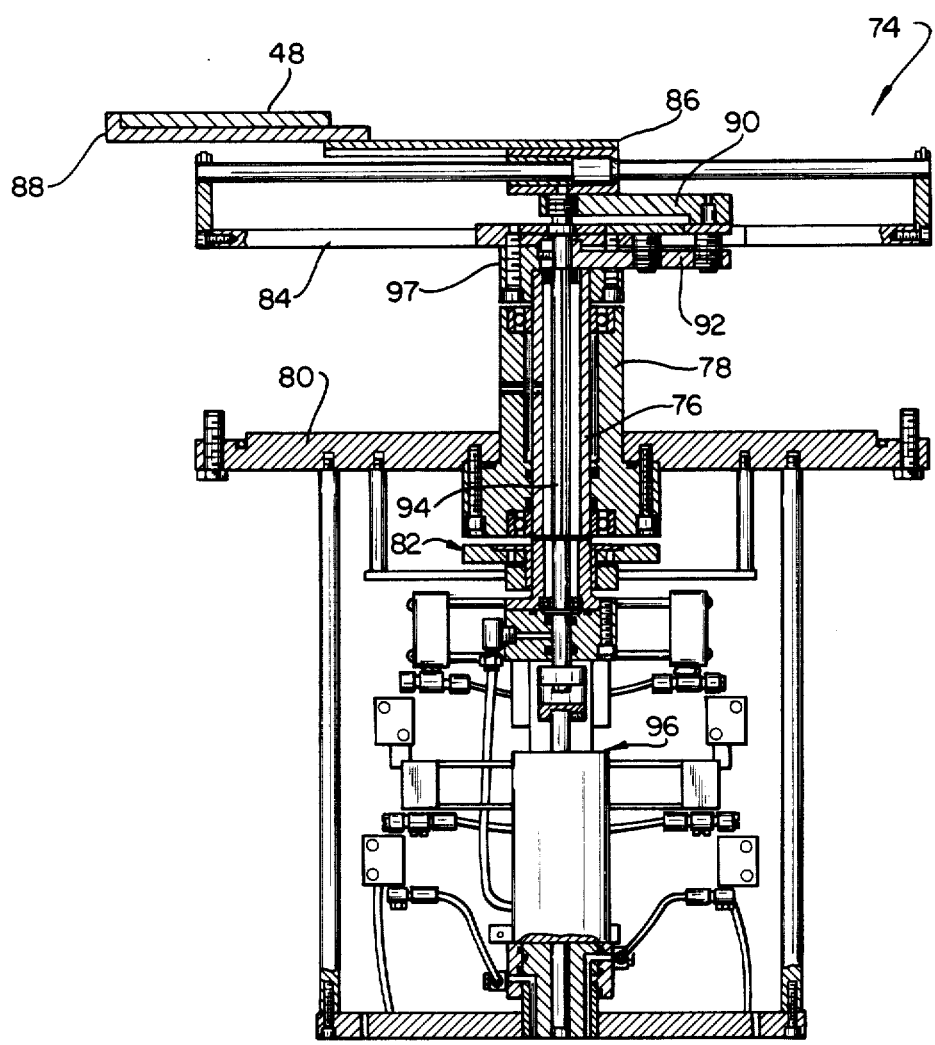

The apparatus for use in coating a plurality of workpieces, such as semiconductor wafers, is broadly denoted by the numeral 10, and is shown in an exploded unassembled perspective view in FIG. 1. System 10 comprises a plurality of individual interconnected modular components including a wafer transfer housing 12, a workpiece inlet housing 14 which may be located at one or more positions, as shown in phantom lines, with respect to the wafer transfer housing, a housing 16 defining a process chamber 15 in which a deposition source is located, a housing 18 in which additional process operations on a workpiece, such as etching and wafer heating can occur, and optionally a housing 20 which can operate as a process chamber simultaneously with the process chamber 15 defined by housing 16.

Housings 14, 16, 18 and 20 are all coupled with housing 12 at locations thereon shown in FIG. 1, although other arrangements are contemplated. In addition, a high vacuum valve 22 can be provided for each of housings 16 and 20 with a Cryo-Torr pump 24 provided for each such high vacuum valve. A Cryo-Torr pump 26 can be provided with a high vacuum valve 28 associated with housing 12 to evacuate the interior of the housing to condition the atmosphere therein for the handling of workpieces.

While a plurality of different types of workpieces can be handled with system 10, the workpieces hereinafter described will be semiconductor wafers which are to be coated on one face thereof in, for example, process chamber 15 during the production of semiconductor components from the wafer. The coating can be done by sputtering as hereinafter described.

Typically, as shown in FIG. 2, inlet chamber 14 and housing 18 will be mounted on one side of a wall 29 in a first room, and all other components, such as housing 12, housing 16 and housing 20 will be mounted on the opposite side of the wall in a second room. In this way, the system can be operated without cross-contamination between the rooms. This is achieved by the use of an isolation valve 30 (FIG. 1) which keeps the two rooms isolated from each other until the wafers are placed in housing 14 and the housing 14 is closed to ambient air. A high vacuum valve (not shown) is coupled to a hole 32 in housing 14 and is used with a Cryo-Torr pump to evacuate the interior of housing 14 after the semiconductor wafers have been placed therein and housing 14 is closed. Typically, the wafers will be carried in a cassette as hereinafter described, and a door 34 provides access to the housing 14.

Similarly, an isolation valve 36 can be located at the entrance to process chamber housing 16 from transfer housing 12. An isolation valve 38 can be located between housing 18 and housing 12, and an isolation valve 40 can be between housings 12 and 20. As an optional feature, inlet housing 14 can be located at the end of housing 12, as shown by the phantom lines in FIG. 1, rather than on the side of the housing 12, as shown in FIG. 2. Again, housing 14 typically will be on one side of a wall, while all other components of system 10 will be on the opposite side of the wall in a separate room.

Figure 5:
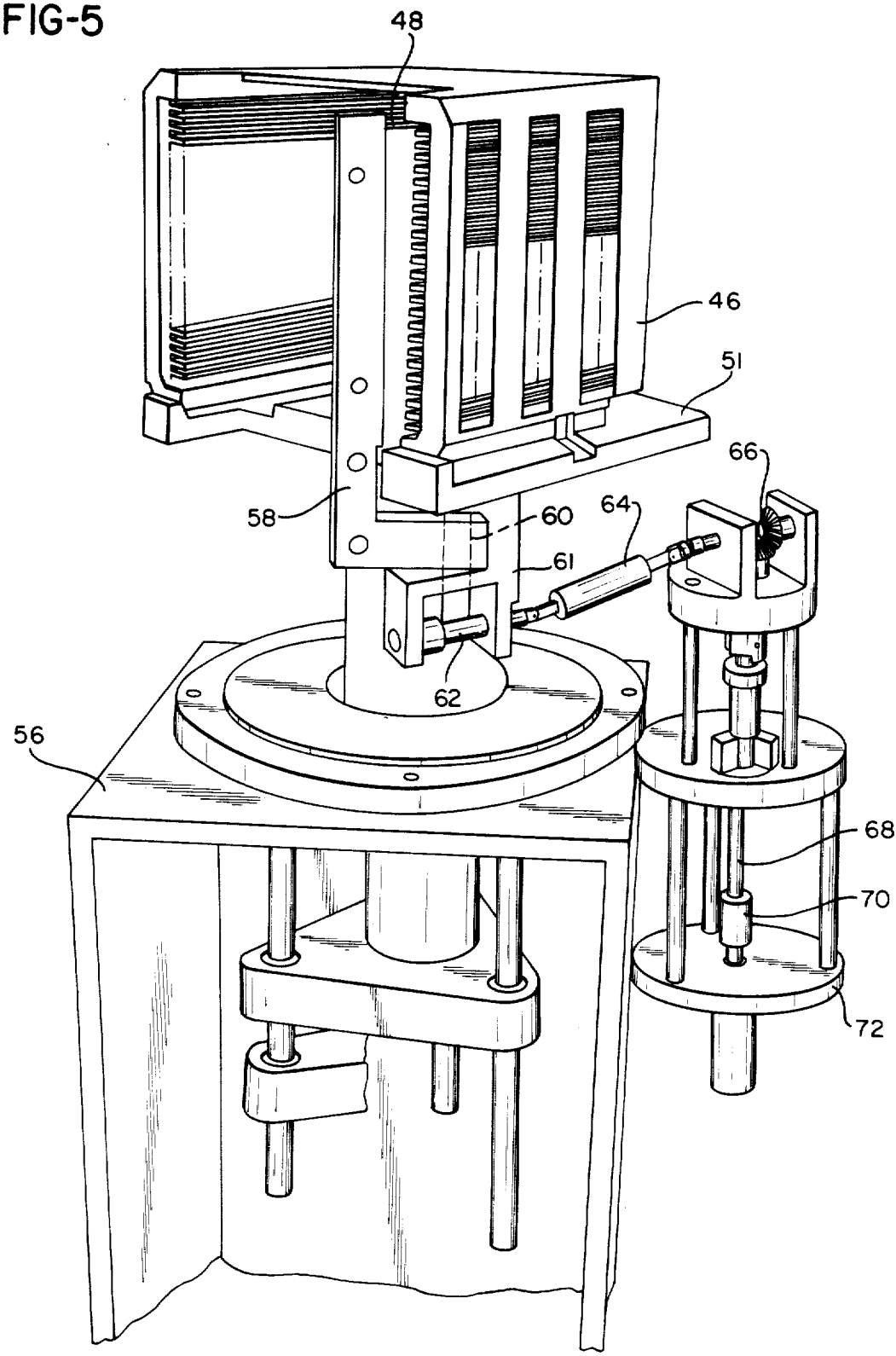
FIG. 5 is a perspective view of the elevating means for the platform for supporting the cassette of FIG. 4.

Housing 14 will be provided with a cassette 46, as shown in FIGS. 2, 4 and 5, containing a stack of semiconductor wafers 48. These wafers are to be fed one by one through the port leading into housing 12, the port being shown as a slit 50 in FIG. 1. Access door 34 allows the placement of cassette 46 in housing 14 on an elevator mechanism hereinafter described with respect to FIGS. 4 and 5. Isolation valve 30 will be actuated to isolate housings 12 and 14 from each other to allow the cassette 46 to be put into place.

As shown in FIG. 4, a platform 51 is mounted in housing 14 for supporting cassette 46 of wafers 48. The platform is mounted on the uppper end of a rod 52 surrounded by a bellows 53 which isolates the interior of housing 14 from the region exteriorly of and below housing 14. A fluid piston and cylinder assembly 54 defines an elevator mechanism and is coupled with rod 52 to incrementally raise the rod, whereby the semiconductor wafers are sequentially elevated so that each wafer will eventually become aligned with slit 50 and thereby will be removable from the cassette and will be moved into housing 12 for transfer to several other locations along the length of the housing.

FIG. 5 shows the elevator mechanism coupled with platform 51 on which cassette 46 is placed. The elevator mechanism is carried by a table-like member 56 on which a vertical bar 58 is swingably mounted by means of a shaft 60 on a bracket 61, shaft 60 having a worm gear (not shown) thereon. Shaft 60 is rotated about its axis by a worm 62 secured to one end of a rotatable linkage 64 coupled by bevel gear means 66 to a rotatable linkage 68 whose lower end is coupled to a rotatable drive means 70 carried by a support 72 attached in some suitable manner to table-like member 56. By actuation of drive means 70, worm 62 is caused to rotate the worm gear on shaft 60 and thereby cause bar 58 to swing into engagement with the protruding edges of the semiconductor wafers 48. Thus, the bar will push the wafers into the cassette, all of which occurs in the event that the wafers protrude after being returned to the cassette following deposition of material thereon and further processing, such as by being etched in housing 18.

Wafers 48 are removed one by one from cassette 46 by a first transfer device 74 near one end of housing 12, as shown in FIG. 2, the details of device 74 being shown more clearly in FIGS. 3a and 3b. Transfer device 74 includes a hollow support shaft 76 mounted in a bearing 78 for rotation relative to a disc-like member 80 by means of a drive means 82. The device 74 further includes a frame 84 defining track means for a shiftable bar 86 having a wafer support segment 88 at the outer end thereof, a wafer 48 shown as being supported on segment 88. The inner end of bar 86 is pivotally mounted by pivot device 90 at one end of a crank 92 coupled to a shaft 94 which is rotated by a second drive means 96 adjacent drive means 82. Shaft 94 extends through hollow shaft 76 and is rotatable relative thereto.

By operation of drive means 96, crank 92 will be caused to rotate in one direction and into a position below a wafer 48 in cassette 46. Then cassette 46 will be lowered slightly to deposit the wafer on segment 88. Bar 86 will then be retracted by operation of drive means 96 in the opposite direction to pull bar 86 inwardly relative to frame 84, thereby moving wafer 48 from the full line position of FIG. 3a to the retracted position shown in FIG. 3b. Then, by actuating drive means 82, hollow shaft 76 can be caused to rotate to thereby rotate frame 84, since the frame is secured by bracket 97 to shaft 76.

The rotating mechanism shown in FIGS. 3a and 3b can position the bar 86 so that the wafer 48 can be moved through an angle of 90° to a first operating position or to an angle of 180° to a second operating position, if desired or needed. For instance, for the arrangement of components as shown in FIG. 2, a semiconductor wafer from housing 14 will be removed from the housing through slot 50 and then rotated 90° and moved to the second position, namely to a carrier 100. If housing 14 is in the position shown by phantom lines in FIG. 1, bar 86 will be rotated through an angle of 180°.

A wafer 48 on the outer segment 88 of bar 86 will be delivered to carrier 100 which is shown at a central zone 97 of housing 12. The carrier 100 comprises a disc-like body (FIGS. 6 and 8), and has a recess 102 therein for defining a shallow well for receiving and confining a wafer 48 in the manner shown in FIGS. 9b and 9c. Carrier 100 has a stub shaft 103 at the lower face 104 thereof, the stub shaft having parallel grooves 106 on opposite sides for releasably mounting carrier 100 on a base 108 at the upper end of a pedestal 110 (FIG. 10) mounted on a table-like support 112 having a fluid piston and cylinder assembly 114 therebelow.

Figure 10:
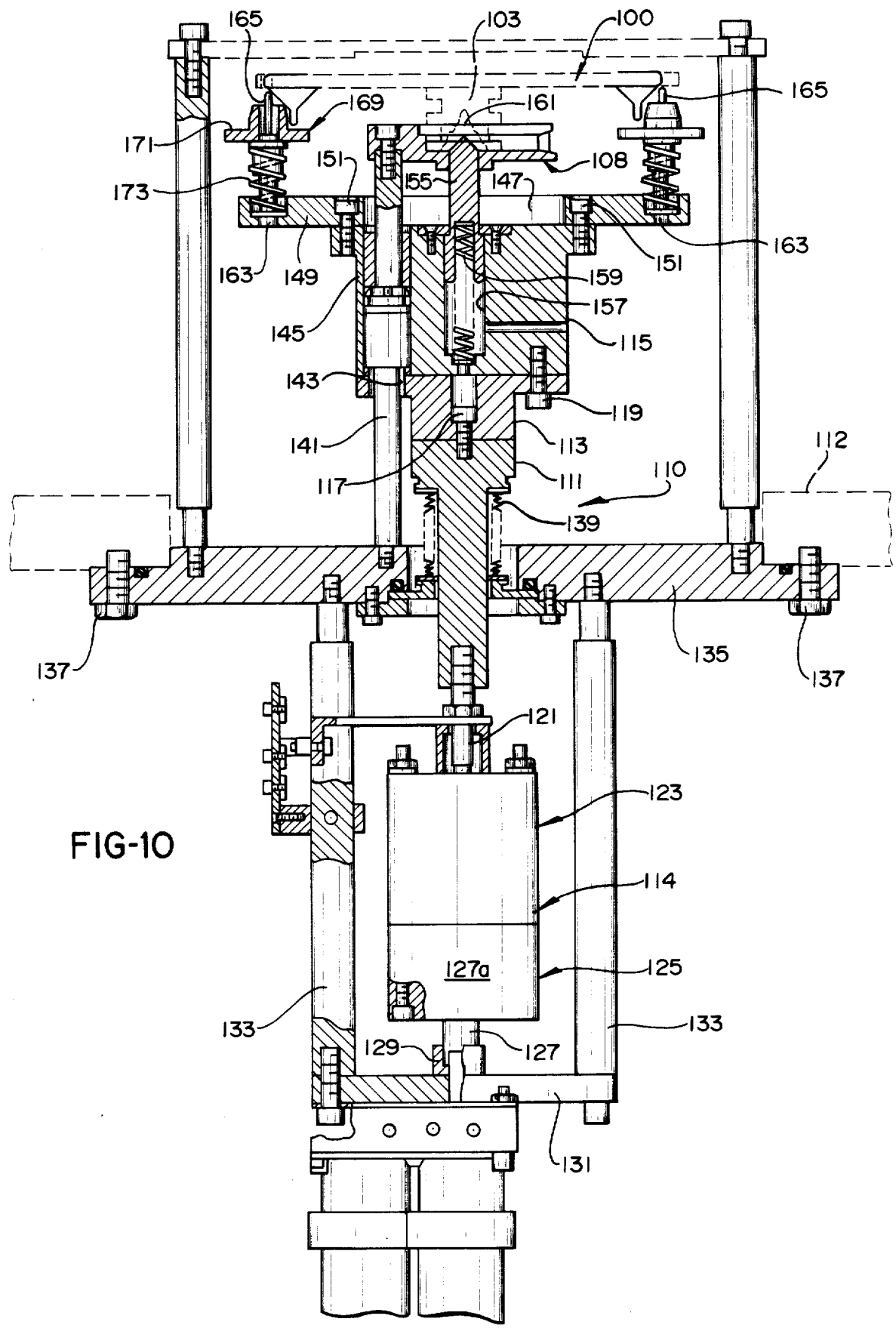
FIG. 10 is a vertical section through a carrier support pedestal showing the way in which the wafer carrier is supported on a pedestal so that a wafer can be placed on and taken off the wafer carrier.

Pedestal 110 is comprised of a number of vertically arranged parts 111, 113 and 115, all of which are coupled to each other by screws 117 and 119, as shown in FIG. 10. The pedestal is coupled at its lower end to the piston rod 121 of a first fluid piston and cylinder assembly 123, there being a second fluid piston and cylinder assembly 125 immediately below assembly 123 and having a piston rod 127 extending below the cylinder 127a coupled with and abutting first assembly 123. The lower end of piston rod 127 bears on a bushing 129 carried by a cross piece 131 at the lower end of a pair of spaced vertical rods 133 whose upper ends are coupled with a support plate 135 secured by screws 137 to table-like support 112 of housing 12. A bellows 139 surrounds a portion of member 111, as shown in FIG. 10, and isolates the interior space of housing 12 from the ambient atmosphere.

A fixed guide rod 141 is secured at its lower end to plate 135 and shiftably extends through a first bore 143 in member 113 and a second bore 145 in member 115. Rod 141 extends upwardly from member 115 and through a central hole 147 in an annular plate 149 secured by screws 151 to the upper face of member 115. The upper end of rod 141 is secured by a screw 153 to base 108. Thus, the base 108 is rigid and does not move relative to support plate 135.

Figure 11:
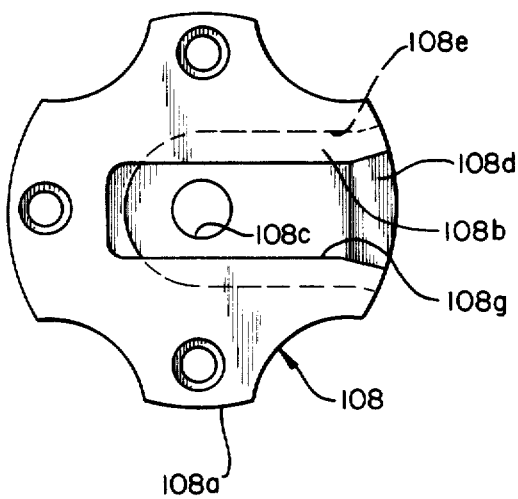
FIG. 11 is a top plan view of the view carrier holder on the upper end of the pedestal of FIG. 10.
Figure 12A:
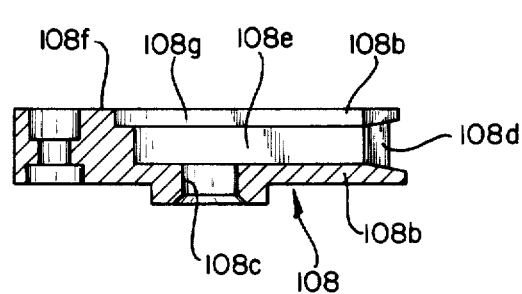
FIGS. 12a and 12b are a vertical section and an end elevational view, respectively, of the carrier holder of FIG. 11.
Figure 12B:
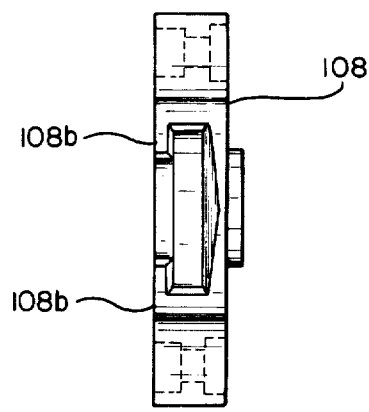
Figure 13:
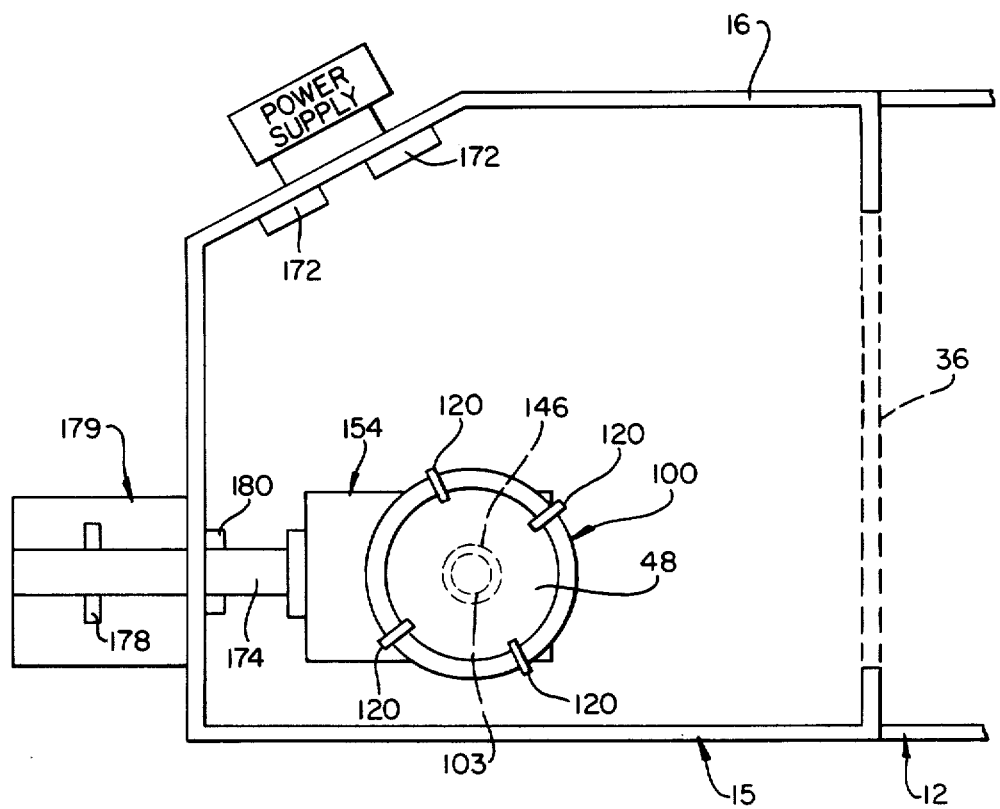
FIG. 13 is a fragmentary enlarged top plan view of the processing chamber forming part of the apparatus, showing the deposition source and the wafer carrier in position on a rotating mechanism before the wafer carrier is rotated 90° to confront the deposition source.

Base 108 is shown in more detail in FIGS. 11-13. Base 108 includes a body 108a provided with a bottom wall 108b having a central hole 108c therein. It also has a side opening 108d and a slot 108e extending from opening 108d to a point past the central hole 108c. The top wall 108f of base 108 has a slot 108g defined by a pair of side flanges 108h. Slots 108e and 108g removably receive stub shaft 103 (FIG. 7) of carrier 100, flange 108h being received in side grooves 106 of shaft 103.

Member 115 has a central bore 157 extending thereinto from the upper end thereof, the bore shiftably receiving the lower end of a stub shaft 155 which is biased upwardly by a coil spring 159 under compression within bore 157. The purpose of stub shaft 155 is to releasably lock stub shaft 103 (FIG. 7) of carrier 100 to base 108, this locking action being accomplished by moving rod 155 upwardly with pedestal 110 until the upper pointed end of stub shaft 155 is received within a conical recess 161 extending into the lower end of stub shaft 103 of carrier 100. Thus, the upper end of rod 155 bears against stub shaft 103 within recess 161, thereby releasably locking the carrier to base 108 during the time when a wafer 48 is to be placed onto or taken off the upper surface of the carrier 100. Stub shaft 155 is elevated into recess 161 when fluid piston and cylinder assembly 123 is actuated while fluid piston and cylinder assembly 125 remains unactuated.

Plate 149 (FIG. 10) has a number of spaced shafts 163 secured to the outer periphery thereof and extending upwardly therefrom. Each shaft 163 has a vertical pin 165 at the upper end thereof, and pins 165 are adapted to enter respective holes 167 through carrier 110, as shown in FIGS. 6 and 8. One of the pins 165 is shown in FIG. 8 as extending through and upwardly from the upper extremity of the corresponding hole 167. A spring release member 169 is provided for each shaft 163, respectively, each spring release member 169 having an annular upper surface 171. Each spring release member 169 is movable downwardly relative to the corresponding shaft 163 against the bias force of a coil spring 173 surrounding the shaft when plate 149 is moved upwardly as assembly 123 is actuated.

Pins 165 are used to support a wafer 48 when the wafer is brought into position near the pins by bar 86 (FIGS. 3a and 3b) after the bar has moved the wafer out of cassette 46 and then toward the pins. The pins 165 are elevated once the wafer is in the position above carrier 100. The pins are raised by actuating fluid piston and cylinder assembly 125 after assembly 123 has been actuated. As the pins are raised due to the upward movement of support plate 149, the pins enter holes 167 of carrier 100 and elevate the wafer from segment 88 on bar 86, allowing the bar to retract and, when doing so, the pins continue to support the wafer. When assembly 125 is lowered, pins 165 descend. During this time, the wafer moves downwardly with the pins and then off the pins and into the recess 102 of carrier 100, as the upper ends of the pins pass below the upper ends of the holes 167.

Carrier 100 has a number of circumferentially spaced spring clip 120 at typically four locations, as shown in FIGS. 6 and 8. The clips are all of the same configuration. To this end, each clip has an end 122 secured by a machine screw 124 to the underside of carrier 100. From end 122, the clip extends downwardly to form a V-shaped lower part 126. From part 126, the clip extends screws upwardly and forms a half loop 128, terminating at an unturned tip 130. The loop 128 is typically seated in a notch 132 (FIG. 8), and tip 130 typically overlies well 102 when the clip is unflexed, as shown in FIGS. 9a and 9c.

Each tip 130 is moved out of well 102, as shown in FIG. 9b, so that a wafer 48 can be placed in the well. This is accomplished when a corresponding spring release member 169 (FIG. 10) is moved upwardly, so that the surface 171 engages the lower end of V-shaped part 126, causing the loop 128 to first move vertically upward and then radially outward in notch 132 until tip 130 clears the well (FIG. 9b). The initial vertical movement of tip 130 prevents any damage to the surface of the wafer 48. Then the wafer 48 can be deposited in the well 102, following which the member 169 is lowered, removing the bias force exerted on V-shaped part 126 and allowing tip 130, due to its own resilience, to move back into overlying relationship to the well, thereby engaging the outer periphery of the wafer 48 so as not to damage the wafer. Once the clips overlie the wafer, the carrier 100 is ready for removal from base 108 (FIGS. 10 and 11) and the wafer carrier 100 can be moved toward process chamber 15 by way of a second transfer mechanism broadly denoted by the numeral 136, as shown in FIG. 2.

Mechanism 136 (FIG. 2) includes a bar 138 mounted on a rotatable frame 140, the bar being movable longitudinally of the frame so that a notch 142 in one end of the bar 138 can straddle the stub shaft 103 and specifically enter the lower pair of grooves 106 in the stub shaft 103 of FIG. 7. The bar 138 is coupled with a crank (not shown) in the same manner in which bar 86 is coupled to crank 92. Drive means coupled to the shaft of the crank causes the crank to pivot to extend bar 138 forwardly of frame 140 so that the bar will be coupled to stub shaft 103 of carrier 100. By reversing bar 138, carrier 100 is shifted toward frame 140, whereupon the frame is rotated to an angle of 90° in a clockwise sense when viewing FIG. 2. Then bar 138 will be advanced sufficiently forward until carrier 100 enters housing 16 and process chamber 15. When this occurs, carrier 100 will become coupled at stub shaft 103 with a shaft mounting means 146 (FIG. 16) which receive stub shaft 103 specifically in lower notches 106 thereof.

Means 146 (FIG. 16) is at the outer end of a tubular shaft 148 carried by bearings 150 on the outer cover 152 of a housing 154. A lock pin 156 is adapted to be received within recess 161 (FIG. 7) in the bottom of stub shaft 103 when a power means 160 coupled with the pin is energized to extend the pin into recess 161. This effectively locks stub shaft 103 to means 146 and allows carrier 100 to pivot from the flat, horizontal position shown in FIG. 16 to the position shown in FIG. 15 which the wafer on the carrier is in a generally vertical plane.

Tubular shaft 148 is caused to rotate relative to housing 154 by means of a first spur gear 162 on shaft 148 in mesh with a second spur gear 164 secured to shaft 166 of a drive means 168 secured by a bracket 170. It is desirable to rotate carrier body 100 and thereby wafer 48 thereon to enhance the deposition of material on the wafer as the wafer receives emission material from deposition source having two parts broadly denoted by the numeral 172 (FIGS. 13 and 15).

Figure 15:
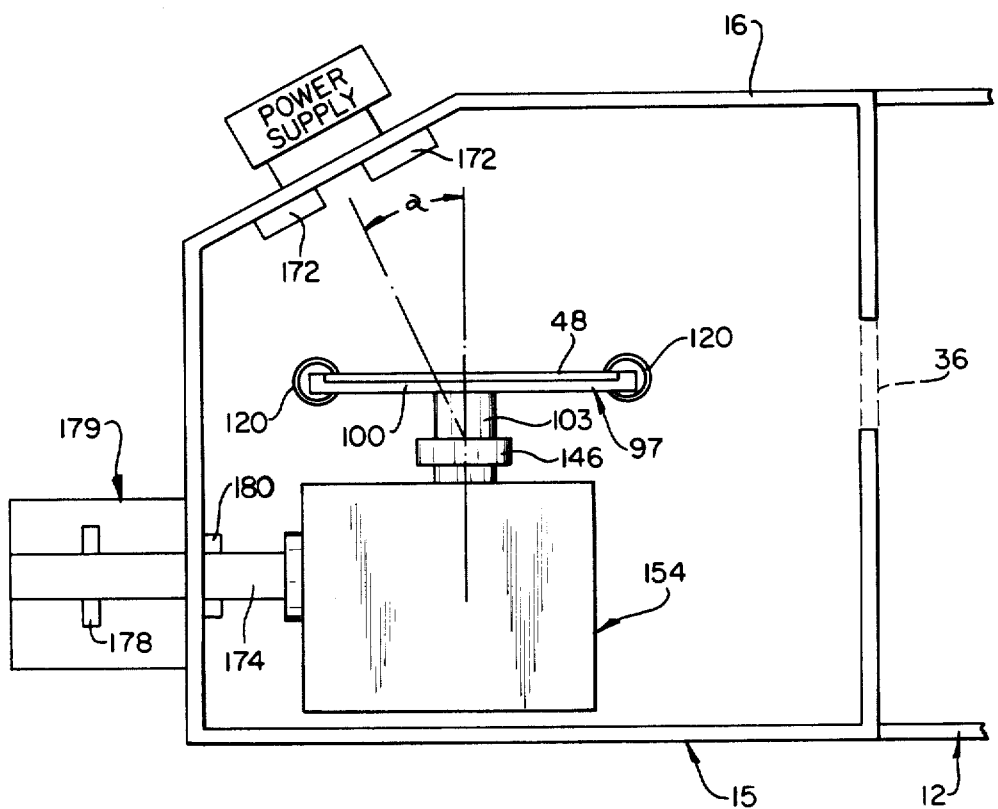
FIG. 15 is a view similar to FIG. 13, showing the carrier and semiconductor wafer after the wafer has been rotated 90°.
Figure 16:
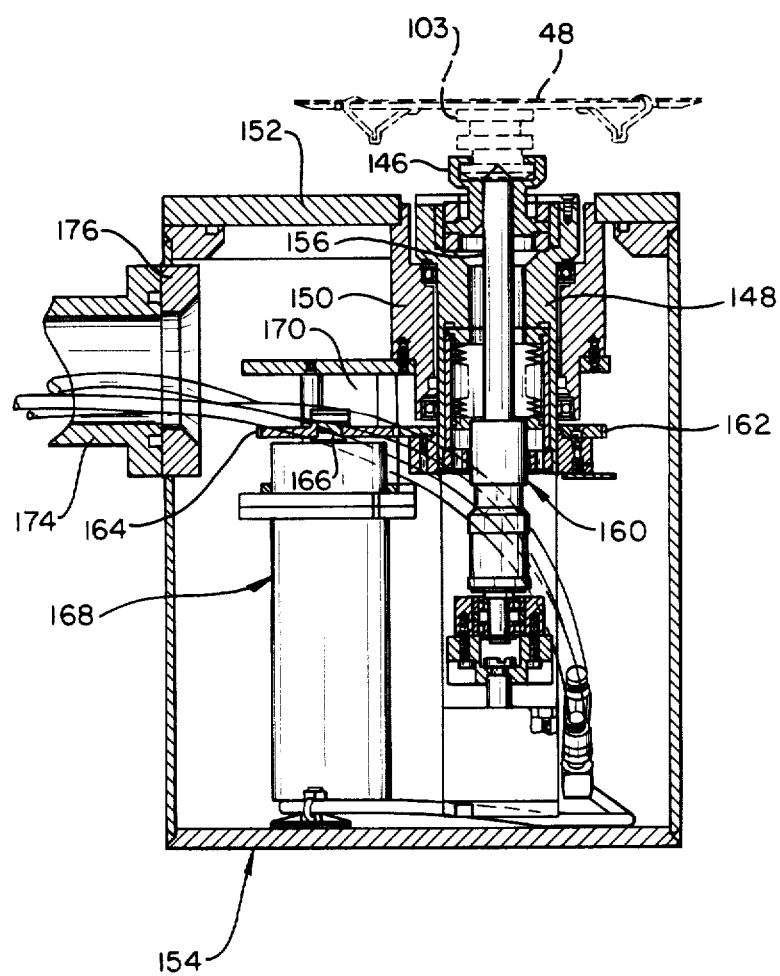
FIG. 16 is a vertical section of the components for releasably mounting the wafer carrier body for rotatable movement relative to the deposition source.

Housing 154 is rotatable to move the wafer 48 from a horizontal plane shown in FIG. 16 to a vertical plane shown in FIG. 15. In the vertical plane, the wafer is correctly positioned for being coated with deposition material from the deposition source 172. To this end, housing 154 is provided with a shaft 174 secured by bracket 176 to the side of housing 154, shaft 174 being coupled by bearings 178 and 180 in any suitable manner exteriorly of housing 154.

Figure 14:
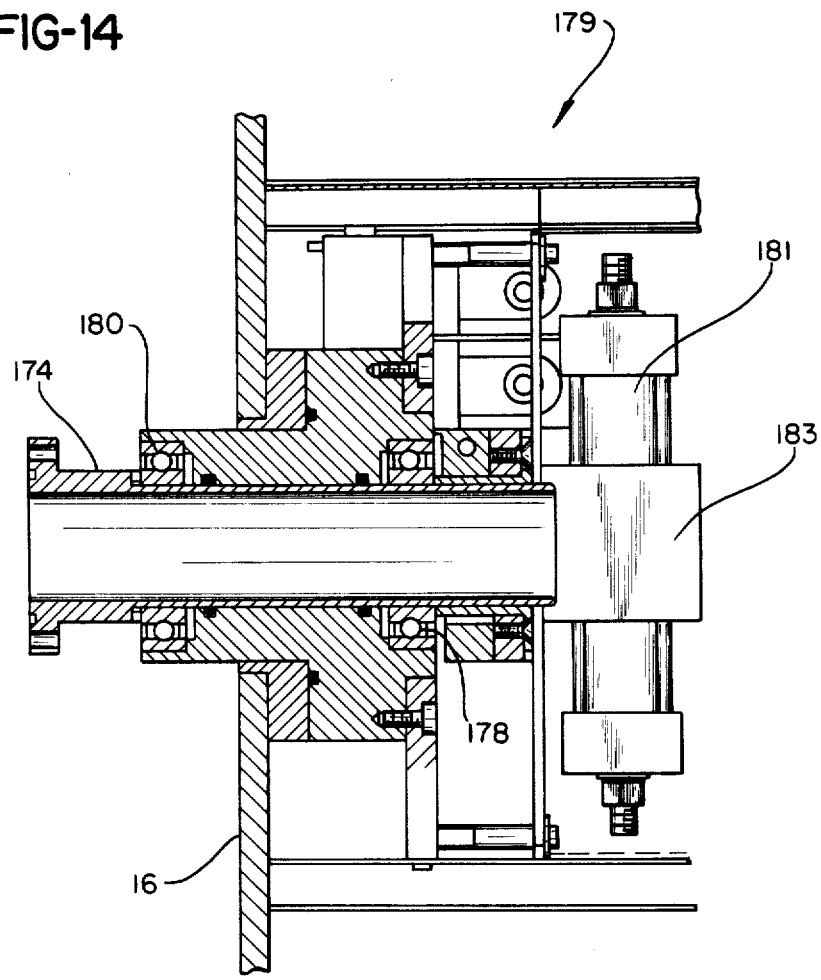
FIG. 14 is a vertical section of the rotating mechanism of FIG. 13.

As shown in FIG. 14, means 179 is provided for rotating shaft 174 back and forth to an angle of approximately 90°. Such means 179 can be of any desired construction, but for purposes of illustration, it includes a power drive means 181 secured by bracket 183 to a support. The drive means 181 is coupled with the shaft 174 in the manner as shown in FIG. 14. By actuating drive means 181, shaft 174 is caused to rotate in a counterclockwise sense to move the wafer 48 from a horizontal plane to a vertical plane. Then, by rotating shaft 174 in a clockwise sense, the wafer is returned to the horizontal position shown in FIG. 16. During the time in which the wafer is moved into a vertical plane, clips 120 hold the wafer on the carrier body 100. The carrier body is held on means 146 by the lock provided by pin 156 in recess 161.

The wafer, after being subjected to the deposition step in process chamber 15, is withdrawn from the process chamber and directed into etch chamber housing 18 or optional housing 20, which can be located at the side of the housing 12 and at the end thereof, as shown in FIG. 2. Movement of the wafer and carrier body 100 out of process chamber 15 is achieved by the use of mechanism 136 (FIG. 2). Also, mechanism 136 is used to advance the wafer and carrier body 100 into etch chamber 18 or housing 20. In all cases, the isolation valves associated with the various housings 12, 16, 18 and 20 are actuated so as to isolate the housings from each other when there is no transfer of wafers therebetween. Thus, they can operate at different negative pressures, depending upon the operations which are to take place in the housings.

To operate apparatus 10, a cassette of wafers 48 is initially placed in the inlet housing 14 when the housing is isolated from the interior of housing 12 through isolation valve 30. Operation is commenced when the interior of housing 14 is opened to housing 12 and transfer mechanism 74 is actuated to advance bar 86 into position to receive the first wafer 48, which will typically be the lowermost wafer. To this end, the elevator mechanism shown in FIGS. 4 and 5 will be in its uppermost position, as shown in FIG. 4 and, as segment 88 on bar 86 moves beneath and is spaced from the lowermost wafer 48, the piston and cylinder assembly 54 increments downwardly so that the wafer directly above segment 88 will become supported by segment 88, whereupon bar 86 is retracted and advances the wafer onto carrier 100 located between transfer mechanism 74 and 136 in FIG. 2.

As the wafer approaches the carrier body 100 location, it will be placed on pins 165 which project upwardly and lift the wafer 48 off segment 88 of bar 86. Then bar 86 is retracted and is made ready for the removal of the next lower wafer from the cassette. Pins 165 are allowed to retract and in doing so, they allow the wafer to lower into recess 102 of carrier body 100, whereupon the clips 120 are moved downwardly into the position shown in FIG. 9c. Then the clips overlie the wafer and releasably secure the wafer to the carrier body 100.

Mechanism 136 is then energized, whereupon bar 138 is advanced to carrier 100, causing the bar to be coupled with stub shaft 103 of carrier 100, thereby effecting a removal of the carrier from its support shown in FIG. 10. Then the carrier is advanced into process chamber 15 where it becomes coupled to means 146 by pins 156 (FIG. 16).

Pin 156 enters recess 161 and locks stub shaft 103 to shaft 148, whereupon drive means 181 (FIG. 14) is energized to rotate housing 154 from the horizontal position thereof, shown in FIG. 16, to the vertical position thereof, shown in FIG. 15. Then the power supply of deposition source 172 is energized to cause emission from the target face of the deposition source and, during this time, shaft 148 is rotated by actuation of drive means 168 (FIG. 16), causing rotation of wafer 48 relative to the deposition source. As a result, the wafer on the carrier body 100 is coated with a thin film of material emitted from the emission surface of the deposition source.

Figure 17:
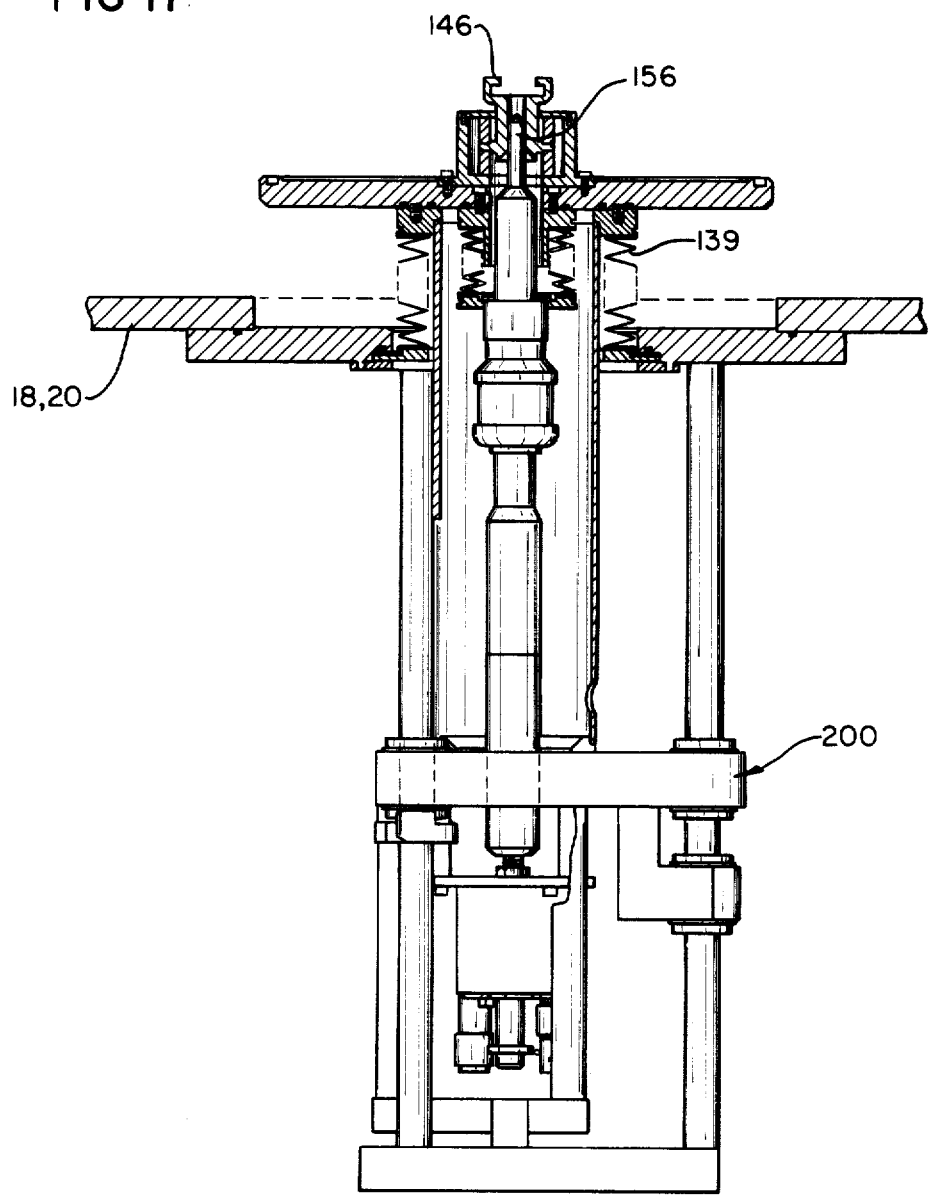
FIG. 17 is a vertical section of the components for releasably mounting the wafer carrier body within one of the process housings.

Following the deposition step, the wafer is returned to a generally horizontal position shown in FIG. 16, pin 156 is retracted to unlock stub shaft 103 from means 146, bar 138 is moved into coupled relationship to stub shaft 103 and moves the wafer and carrier body 100 out of process chamber 15. Then the wafer and carrier can be moved, if desired, into etch chamber housing 18 or housing 20. The wafer carrier body 100 is removed from the mechanism 136 and retained within the housing 18 or 20 for processing using an assembly, as shown in FIG. 17, which is similar in construction and operation to the assembly shown in FIG. 16. However, the assembly shown in FIG. 17 is not constructed to rotate the carrier body 100 when retained thereby, rather pin 156 being movable only longitudinally by means of drive means 200 for engaging recess 161 within stub shaft 103 to cooperate with means 146.

Following the process operations on the wafer, the wafer and carrier body are then returned by transfer mechanism 136 to the control zone, pins 165 are again used to lift the wafer off the carrier. When the pins 165 are elevated as shown in FIG. 10, bar 86 of transfer mechanism 74 moves beneath the wafer, and the wafer settles on the segment 88 as the pins are retracted, whereupon the transfer mechanism 74 then moves the wafer back into the cassette in a desired slot thereof. After all of the wafers have been returned to the cassette, bar 58 (FIG. 5) is pivoted to cause the bar to engage any protruding extremities of the wafer to force the wafers into the cassette. Then the cassette can be removed from inlet housing 14 and replaced by a new cassette of wafers.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of processing a plurality of workpieces comprising placing a plurality of workpieces in a first chamber adjacent to a transfer region, moving a workpiece out of the first chamber into the transfer region when the first chamber is closed to the ambient atmosphere, advancing the workpiece through the transfer region and into a second chamber, processing the workpiece in the second chamber, returning the workpiece through the transfer region to the first chamber, and repeating the moving, advancing, processing and returning steps for each workpiece of the plurality until all of the workpieces have been processed in the second chamber.

2. A method as set forth in claim 1, wherein said workpieces are semiconductor wafers.

3. A method as set forth in claim 1, further including the step of transferring each workpiece to a workpiece carrier at a first zone in the transfer region after the workpiece has been moved out of said first chamber and before the workpiece is directed into the second chamber.

4. A method as set forth in claim 1, further including the step of rotating the workpiece in the second chamber as the processing step is being performed to place the workpiece in a predetermined orientation for processing.

5. A method as set forth in claim 1, further including the step of rotating the workpiece in one direction about a first axis as the processing step is being performed, and rocking the workpiece about a second axis generally perpendicular to the first axis as the workpiece rotates about said first axis in said one direction.

6. A method as set forth in claim 1, wherein said processing step includes depositing a thin film on the workpiece.

7. A method as set forth in claim 1, further including the step of transferring a workpiece from the second chamber to a third chamber, and processing the workpiece in the third chamber before the workpiece is returned to the transfer region.

8. A method as set forth in claim 1, further including the step of evacuating the first and second chambers and the transfer region before the workpiece is transferred from the first chamber to the second chamber for processing.

9. A method as set forth in claim 1, wherein the step of advancing the workpiece through the transfer region includes shifting the workpiece out of the first chamber to a first location, rotating the workpiece at said location through a predetermined angle, directing the workpiece to a first zone in the transfer region, releasably coupling the workpiece to a carrier, moving the carrier and workpiece attached thereto to a second zone aligned with the second chamber, and moving the carrier and workpiece thereon into the second chamber.

10. A method as set forth in claim 9, wherein said returning step includes shifting the carrier from the second chamber to the central zone, separating the workpiece from the carrier, shifting the separated workpiece to the first location, moving the workpiece until it is aligned with the first chamber, and shifting the aligned workpiece into the first chamber.

11. A method as set forth in claim 9, further including the step of releasably gripping the workpiece at the outer periphery thereof to secure the same workpiece to the carrier.

12. A method as set forth in claim 11, further including the step of releasing the gripping action to allow the workpiece to be placed onto and separated from the carrier.

13. A method as set forth in claim 1, wherein said processing step includes sputtering a thin film on a face of the workpiece.

14. A method as set forth in claim 13, wherein said workpiece comprises a semiconductor wafer.

* * * * *

UNITED STATES PATENT AND TRADEMARK OFFICE
CERTIFICATE OF CORRECTION

PATENT NO. : 4,717,461

DATED : January 5, 1988

INVENTOR(S) : Strahl, et al.

It is certified that error appears in the above-identified patent and that said Letters Patent is hereby corrected as shown below:

Column 1, line 33, "surface" should read --source--.
Column 10, line 19, "mechanism" should read --mechanisms--.
Column 10, line 29, "position" should read --positions--.
Column 10, line 37, "pins" should read --pin--.
Column 11, line 3, "control" should read --central--.

Signed and Sealed this

Fourteenth Day of June, 1988

Attest:

DONALD J. QUIGG

*Attesting Officer*   *Commissioner of Patents and Trademarks*